United States Patent [19]

Poirier

[11] Patent Number: 4,811,286

[45] Date of Patent: Mar. 7, 1989

[54] MAGNETIC BUBBLE MEMORY DEVICE

[75] Inventor: Michel Poirier, Eragny, France

[73] Assignee: Societe d'Applications Generales, Paris, France

[21] Appl. No.: 9,665

[22] Filed: Feb. 2, 1987

[30] Foreign Application Priority Data

Feb. 5, 1986 [FR] France .............................. 86 01578
Dec. 16, 1986 [FR] France .............................. 86 17580

[51] Int. Cl.$^4$ .............................................. G11C 19/08
[52] U.S. Cl. ............................................ 365/43; 365/8; 365/36
[58] Field of Search .......................... 365/7, 8, 43, 36

[56] References Cited

U.S. PATENT DOCUMENTS 4,471,467 9/1984 de Jonge et al. .................. 365/8

FOREIGN PATENT DOCUMENTS 2264361 3/1974 France .

OTHER PUBLICATIONS

IBM Technical Disclosure Bulletin-vol. 16, No. 10, Mar. 1974, p. 3395.

IBM Technical Disclosure Bulletin-vol. 19, No. 7, Dec. 1976, pp. 2802-2803.
Patent Abstracts of Japan, Japanese 58/177586-Hitachi.
Patent Abstracts of Japan, Japanese 56/25282-Oki Denki Kogyo.
Patent Abstracts of Japan, Japanese 56/58187-Fujitsu.

Primary Examiner—James W. Moffitt
Attorney, Agent, or Firm—Larson and Taylor

[57] ABSTRACT

A magnetic bubble memory has a reading zone with thin detection elements, coated with an insulating layer which carries thick bubble propagation patterns of high magnetic permeability material, and a bubble stretching zone also including thick propagation patterns of shapes such that the rotating field of the device causes the bubbles to progress along the patterns. The device further includes, out of the detection zone, additional thin localized elements of high magnetic permeability material having a thickness much lower than that of the patterns, obtainable by photolithography and located at the same level as the thin detection elements. When located in the stretching zone, the thin patterns are arranged to cooperate with thick patterns so that the voltage well generated by the rotating field of the device has a substantially constant value while moving along the thick patterns.

10 Claims, 3 Drawing Sheets

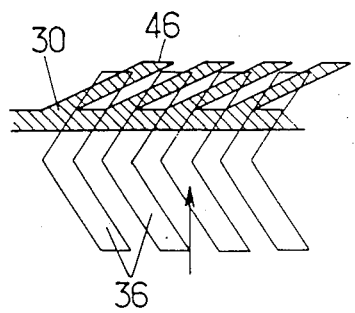
FIG. 6.
FIG. 8.
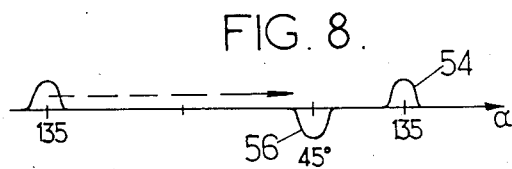
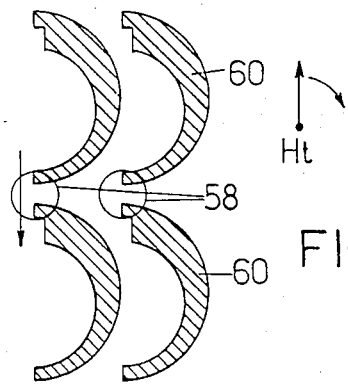
FIG. 9.

PRIOR ART
FIG. 7A.
FIG. 7B.
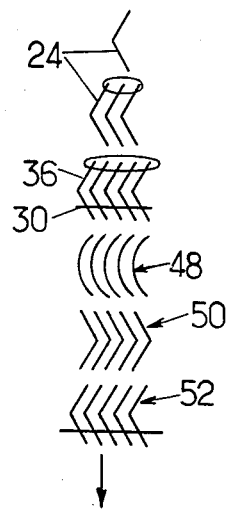
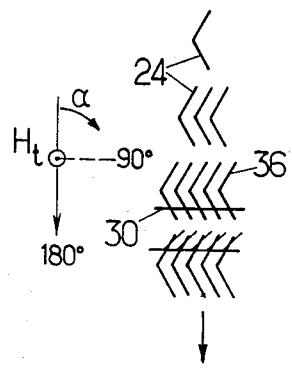
FIG. 10.
PRIOR ART
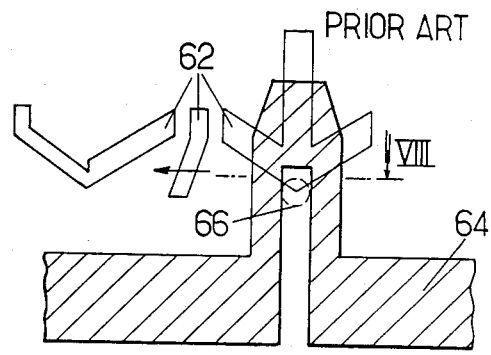
FIG. 11.
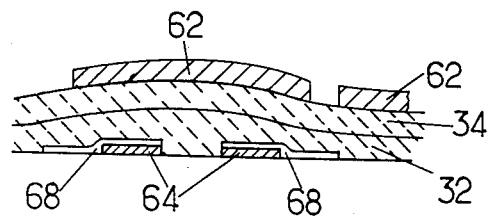
FIG. 12.
PRIOR ART
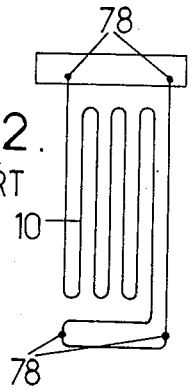
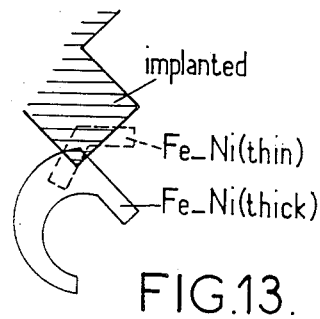
FIG. 13.

MAGNETIC BUBBLE MEMORY DEVICE

FIELD OF THE INVENTION

The invention relates to magnetic bubble memory devices, suitable more particularly for storing and recovering data. It relates more particularly to devices using bubbles of very small diameter (for example from 0.7 to 1.3 microns) for increasing the storage density and for forming high capacity memories.

Bubble memories have a well known general construction. They include a substrate (generally made from magnetic garnet) having an implanted bubble storage surface layer. This layer is coated with an insulating material (generally silicon oxide) which has, in a reading zone, detection elements made from a magnetoresistive material. These elements are coated with another insulating layer which has bubble propagation patterns, formed from high magnetic permeability material. The patterns are generally made from an iron-nickel alloy by photolithography and are relatively thick (in practice 300 to 400 microns).

PRIOR ART

The storage of small diameter bubbles is now well mastered. It is not the same for reading them. In fact, the small diameter bubbles must be streched so as to read them using detection elements, generally formed by thin and narrow iron-nickel strips. For stretching them a so called stretching zone or "stretcher" is provided, between the storage zone and the detector, formed of rows of thick iron-nickel chevrons, whose role is to stretch the bubbles while propagating them.

This technique, when it uses chevrons of conventional form, scarcely allows a bubble diameter of less than 1.5 micro. Under that size the leak flux and the signal become weak. It is difficult simultaneously to propagate, to stretch and to detect the bubble.

Different solutions have been proposed for improving the detection. One consists in using patterns having the shape of a new moon, with thin ends. It is difficult to form such thick iron-nickel patterns by photolithography. It has also been proposed to increase the size of the patterns in the detection zone, which appreciably increases the space occupied for a very limited result. Finally, additional surface electric conductor lines have been used in the detection zone. But they require the addition of contact studs which take up space and external current generators.

SUMMARY OF THE INVENTION

It is an object of the invention to provide a bubble device in which the operations in the different zones having thick patterns are improved. It is a more specific object to enhance bubble stretching without rendering it necessary to add a manufacturing step.

For that, it uses the fact that it is necessary to provide on the device, for detection purposes, a layer occupied by relatively thin magnetic material elements; it is based on the finding that one of the causes which trouble operation and limit stretching is the weakening of the propagation poles moving through the patterns in certain positions of the patterns particularly in the stretching zone.

The invention consequently provides a magnetic bubble memory device having a reading zone with thin detection elements, coated with an insulating layer which carries thick bubble propagation patterns of high magnetic permeability material, and a bubble stretching zone also including thick propagation patterns of shapes such that the rotating field of the device causes the bubbles to progress along the patterns, characterized in that it further includes, out of the detection zone, additional thin localized elements of high magnetic permeability material having a thickness much lower thna that of said patterns, obtainable by photolithography and located at the same level as the thin detection elements. The additional elements are so distributed and shaped as to improve the operations which take place in the zone where they are positioned. In the stretching zone, their positioning is such that they cooperate with the thick patterns so that the voltage well generated by the rotating field of the device has a substantially constant value while moving along the thick patterns.

In a specific embodiment of the invention, each thin detection element consists of a band provided with barbs each constituting a chevron branch extending beyond the thick patterns associated with the detection element toward the adjacent thick patterns and having an inclination angle which tends to improve propagation of bubbles under the action of the rotating field.

Since the localized elements are quite thin, they may without difficulty be formed by photolithography in a small width and they are magnetized even for a very low value of the rotating field. It is then sufficient to give them a small length. The addition of these elements does not complicate the manufacture of the devices, for they are placed at the same level as elements which are in any case necessary in the reading zone. The ratio between the thickness of the thin elements and thick patterns is typically of from 1/5 to 1/10.

When the thick patterns are in the form of chevrons, which is the most frequent case, the thin localized elements in the stretching zone will be generally formed by strip sections made from a thin layer of high magnetic permeability material, each placed substantially half way along the legs of a chevron and below these legs, so as to create an additional pole in the middle of each leg. These thin elements may be more particularly of iron-nickel, whose high permeability is used.

The term "chevrons" should not be interpreted in a narrow sense, but as covering all usual modifications of the basic form used at present, particularly the form of a banana, with a split leg on one side, or in which each leg includes two fractions joined together to form an obtuse angle.

The invention will be better understood from the following description of particular embodiments, given by way of examples.

BRIEF DESCRIPTION OF THE DRAWINGS

FIG. 6 is a schematical representation of a modification of the detection elements of FIG. 2, according to an embodiment of the invention;

FIGS. 7A and 7B are schematic illustrations of a conventional construction of a detection zone (FIG. 7A) and of a construction according to an aspect of the invention (FIG. 7B);

FIG. 8 indicates how the bubbles move responsive to angle α of the rotating field in a construction according to FIG. 7B.

FIG. 9 is an illustration of thin elements added in the propagation zone;

FIG. 10 illustrates a conventional construction for writing bubbles by nucleation;

FIG. 11 is a cross-section along line XI of FIG. 10, illustrating additional thin elements;

FIG. 12 is a schematic illustration of a storing zone having folded loops;

FIG. 13 is a schematic illustration of a transition zone between a register obtained by ion implantation and a register defined by thick chevrons.

DETAILED DESCRIPTION OF THE INVENTION

Figure 1:
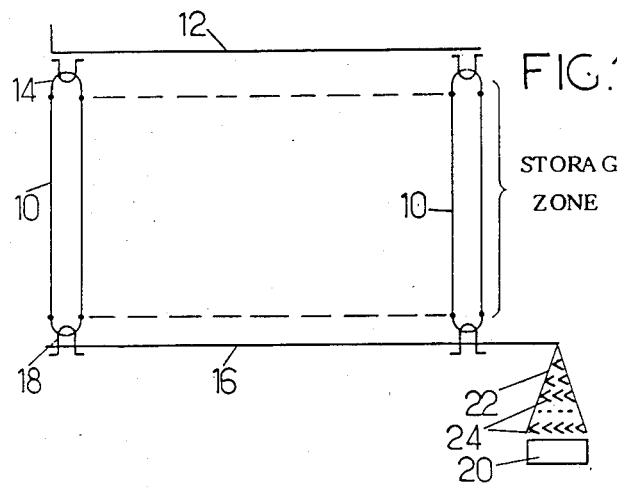
FIG. 1 is a general diagram showing the general construction of a small diameter bubble memory device.

Referring to FIG. 1, a magnetic bubble memory device of conventional construction includes a storage zone having a plurality of storage loops 10 coupled to a write line or "track" 12 by transfer-in gate means 14 and to a read line or "track" 16 by replicate gate means 18. The reading line 16 brings the bubbles to a reading or detector zone 20 through a stretching zone 22. The stretching zone is conventionally formed by rows of chevrons 24.

Figure 2:
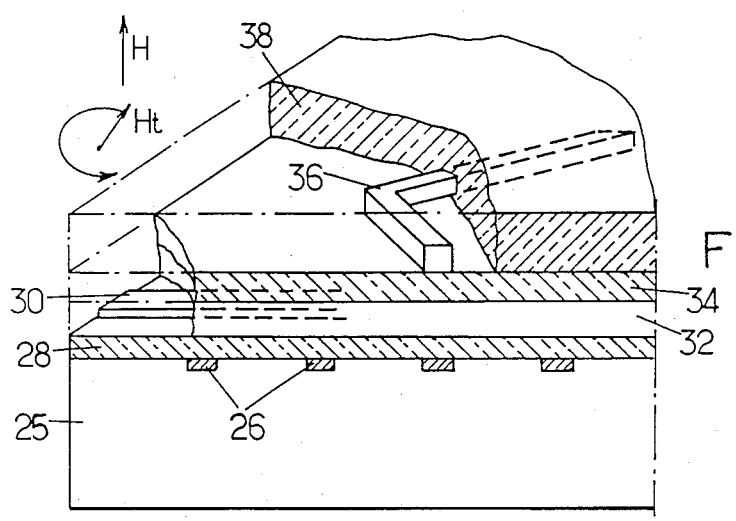
FIG. 2 is an elevational view, in which the scale has not been respected, showing a construction frequently used for the reading zone of a memory device of the kind shown in FIG. 1.

In the reading zone 20, the device has generally the construction shown in FIG. 2: it includes a substrate 25 formed by a garnet of 0.6 to 1.5 micron in thickness when it is desired to obtain bubbles whose diameter is about 1 μm. The bubbles are formed in a layer obtained by epitaxial growth or more frequently in patterns 26 implanted at the surface of the garnet. These patterns are coated with an insulating spacing layer 28, generally of silicon oxide, about 100 nm thick. On this spacing layer are deposited thin detection elements 30, only one of which is shown in the form of a strap. These detection elements are thin (30 to 80 nm, and typically 40 to 60 nm) so that they can be readily formed by a photolithography process, and they are generally of iron-nickel chosen for its magneto-resistive properties. The reading elements are very close to the garnet 24, since they are only separated therefrom by the spacing layer 28. An insulating layer 32, frequently of silicon oxide, and an additional layer 34 which is also insulating, frequently of polyimide, separate the reading elements 30 from propagation patterns 36, only one of which is shown, made from a material of high magnetic permeability. These patterns generally have a thickness between 300 and 400 nonometers, which makes it difficult to make them very narrow, and are frequently in the form of chevrons. They are of iron-nickel, optimized so as to have high magnetic permeability, or of amorphous material.

The patterns are finally coated with a new insulating and protective layer 38.

The device is provided with means, not shown, for applying to the system a continuous bias field H and a rotating propagation field Ht.

There exist a number of bubble memory devices having the hereinabove summarized construction. Consequently, there is no need to provide a detailed description. However, reference may be had to the documents which will be identified later and also to French Pat. Nos. 2 264 361 (FUJITSU) and 2 537 321 (INTEL).

Figure 3:
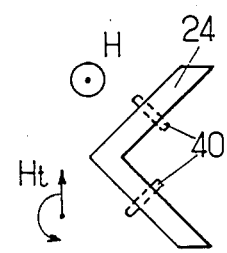
FIG. 3 shows schematically the superimposition of the thick patterns and of the localized elements in a stretching zone putting the invention into practice.

In a device whose stretching zone 22 is formed solely of chevrons 24, having either the simple form shown in FIG. 2, or one of the more elaborate already known forms, it is difficult to achieve satisfactory stretching of the bubbles. One of the reasons is that the actual bias field which prevails in the chevrons changes greatly during rotation of the rotating field Ht, as well as the pole created in the chevron. In a chevron as shown in FIG. 3, the pole has a maximum value when the rotating field magnetizes the ends of the arms, an intermediate value when the rotating field is directed along the axis of the chevron and a minimum low value when the rotating field is perpendicular to an arm of the chevron. During a 180° rotation of the rotating field, the bubbles retract at the time when the poles created are of low value.

It may be thought that the difficulty could be overcome by using larger chevrons. But in a weak field, these chevrons may themselves create bubbles. It might also be thought that a different form of chevron, having narrow ends, would improve the situation. But it is difficult to deposit thick elements of small width.

According to the invention, the difficulty is overcome by providing, at the same level as the detector elements 30, localized elements of a material having a high magnetic permeability, placed so as to "fill" the hollows of the curve representing the variation of the value of the pole during propagation.

As shown in FIG. 3, all localized elements are thin and narrow iron-nickel strip sections 40. The width of these strips is less than that of the chevron and is such that the pole value does not decrease to such a low value that there would be contraction of the bubble during its propagation along an arm. However, the reinforcement should not be such that the bubble could be trapped. In practice it will be advisable to obtain a potential well of constant depth moving along the chevron.

Figure 4:
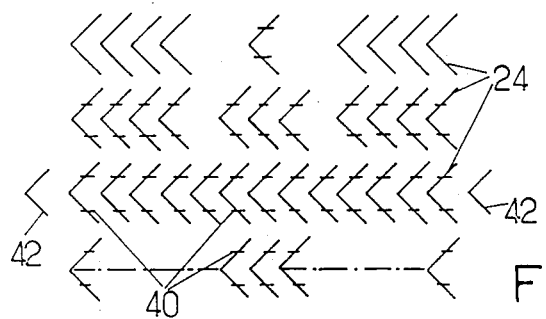
FIG. 4 shows a general advantageous arrangement of the thick patterns in the stretching zone.

Instead of placing the section 40 perpendicularly to the arm, as shown in FIG. 3, an arrangement can be adopted as shown in broken line on FIG. 4. In FIG. 4, each of the rows of chevrons 24 of the stretching zone extends substantially over the same length. But the triangular arrangement shown schematically in FIG. 1 is reconstituted by the presence of gaps. The "guard" chevrons which surround the active chevrons, improve smoothness. The additional chevrons 42, of smaller development than the active chevrons and mutually spaced by a gap greater than the pitch between the active chevrons, prevent a stretched bubble from rolling up round the last chevron.

Figure 5:
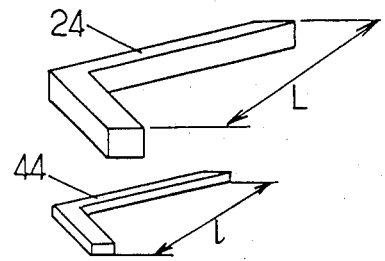
FIG. 5 shows as modification of FIG. 3.

Referring to FIG. 5, it is also possible, although this solution is often less advantageous, to place a thin chevron 44 under each thick chevron 24. Each chevron 44 ends in the vicinity of the middle of the arms of the chevron placed above. In practice, the span 1 of the chevrons 44 may be substantially equal to half the span L of chevrons 24.

The same principle which is used above, i.e. avoiding perturbation of the voltage well, is applicable to other zones of the device, including the detection zone.

For instance each detection element of thin iron-nickel has a tendency to retain the bubbles and to maintain them in a position delayed with respect to the rotating field Ht when the element consists of a narrow strip, as shown in FIG. 2.

That difficulty is considerably attenuated if a detection element 30 is used which additionally includes barbs 46 which each act as a chevron arm. The barbs are so located as to enhance bubble propagation.

As illustrated in FIG. 6, the barbs project beyond the corresponding chevrons 36, thereby reducing the gap between chevrons 36 and the next chevron row. Their slope with respect to the strip is greater than that of the chevron arms. One of the results which is obtained consists in an improvement in the lower portion of the bias field.

When the read zone has elongated strips provided with barbs, the overall construction of the detection zone may, be considerably simplified, as compared with the conventional arrangement of FIG. 7A. In the conventional arrangements, the read zone comprises thick chevrons 36 and thin iron-nickel detection elements 50 and then, in succession, a row of bubble absorption chevrons 48, a row of inverted chevrons 50 for repulsing bubbles and a dummy detector 52 having a construction which is similar to that of the active detector. In a conventional arrangement, detection is carried out by differentical measurements between the strip 30 and the strip of the dummy detector 52.

Collapse of the bubbles caused by absorber 48 is difficult when low diameter bubbles are used in a material which has a high anisotropy field (resulting into perturbed operation of the device at low temperature, with higher anisotropy field).

Operation of the read zone of the device is improved when barbs as illustrated in FIG. 3 are used, since the distance between the outer end of the barbs 46 and the end of the next row of chevrons (after row 48) may be reduced to a very low value because the ends are at two different levels. The bubbles may consequently more easily be transferred from the detector to the absorber and the risk of trapping is decreased.

In the presence of barbs 46, the signal peak corresponding to the transfer of a bubble is quite localized. Consequently, the active detector and the dummy detector, corresponding to the two arms of a differential measurement bridge, may be located on two successive rows of chevrons, however under opposed branches of the respective chevrons. Then the arrangement is as illustrated in FIG. 7B. It is not necessary to cause bubble collapse any longer. Since the bubbles have a precise localization, a pulse 54 due to arrival of a second bubble on the detection element 30 cannot be masked by the pulse 56 due to passage of a preceding bubble, as shown in FIG. 8.

Referring to FIG. 9, short elements 58 of low thickness, consisting of material having a high magnetic permeability (iron-nickel for instance) are located between successive rows of thick iron-nickel patterns 60 in the propagation zone, corresponding to the storage loops illustrated in FIG. 1. The short elements 58, which again are at the same level as the detection elements 30, compensate the loss of depth of the voltage well when the bubble crosses a gap between two successive patterns. Due to the limited accuracy in the photolithography process used for creating the thick patterns, that gap has a minimum value which may be so high that bubbles fail to cross the voltage barrier which exists, even with patterns having a relatively high bubble propagation spaced period. The thin iron-nickel patterns of the invention may have a shape selected for obtaining a substantially constant value of the voltage well across the gap. Such patterns may have a small size and may be quite accurately shaped and sized since they are thin. As illustrated in FIG. 9, they are of substantially circular shape and they are associated with thick half disk patterns having a stepped end for offsetting the pole. However, possible with a modified shape, thin elements 58 could be used with other shapes of propagation patterns, for instance with shapes as described in "An 8 μm period bubble memory device with relaxed function designs", IEEE transactions on magnetics, vol. MAG-15, No. 6, November 1979, pages 1692-1696.

In still another embodiment of the invention, again suitable for use in combination with the preceding embodiments, thin iron-nickel elements are used in the zone where bubbles are written by a nucleation process. In a conventional embodiment, bubbles are written in with an arrangement as shown in FIG. 10, which includes thick iron-nickel patterns 62 and a conductive track 64, located at a deeper level and arranged for receiving current pulses. One of the problems associated with the bubble storage devices operating with bubbles of low diameter is associated with the required current density in the conductive tracks 64. The current density to be used is approximately in direct relation with the anisotropy field in the substrate. For low diameter bubbles, the current values are so high that the life duration of the conductive tracks is reduced, due to an electromigration process.

Due to the invention, the current which is necessary for nucleation may be reduced and the location where the bubble is generated (theoretically at location 66 at the point of the thick writing pattern) may be more accurately defined. Referring to FIG. 11 that result is attained by locating additional thin Fe-Ni elements 68 at the same level as elements 30 for helping gap crossing by the bubbles. The additional elements 68 may overlap the electrically conductive trucks 64, as indicated at 68 on FIG. 11. They are separated from the thick iron-nickel patterns by insulating layers 32 and 34.

Due to the resistivity difference between the iron-nickel which constitutes the thin elements 68 of high magnetic permeability and the metal (typically gold or aluminum) which constitutes the conductive tracks, the thin elements 68 may be directly deposited on the conductive tracks 64. It is not necessary to describe the arrangement of the elements in FIG. 11 since it may be similar to that already mentioned.

Bubble memory devices are generally organized for block access, according to an arrangement which may be as described in "Block-Replicate Chip Operation at 250 KHz over the Temperature Range −25° C. to 75° C.", IEEE TRANSACTIONS ON MAGNETICS, vol mag-15, No. 1, Jan. 1979, pages 879-885. Then it is necessary to locate a number of serially arranged replication gates and there arises a problem similar to that associated with writing in of the bubbles: since the current for splitting the bubbles must have a high value and the thickness of the conductive tracks cannot be increased without detrimentally affecting the flatness of the iron-nickel patterns, voltages become necessary which are hardly compatible with the currently available integrated circuits, even if a number of conductive lines are connected in parallel relation. Again, using additional thin iron-nickel elements makes it possible to decrease the current value which is necessary for splitting bubbles, by concentrating the flux lines generated by the electric current flowing along the tracks and by reducing the detrimental effect of the conductive tracks on the flatness of the thick iron-nickel patterns: any decrease in the thickness of the track is favorable in that flatness is improved and the distance of the patterns to the substrate is decreased.

The invention is also suitable for use in the bubble memory devices in which each storage loop is folded for increasing the distance between the replication or transfer gates of neighboring registers and for reducing the interactions between such gates, as shown in FIG. 12. It is then necessary to retain a large space distribution period (for instance 32 μm) for the thick iron-nickel patterns in the input-output registers, due to the presence of the conductive tracks which increase the distance between the patterns and the substrate. On the other hand, the storage zone is designed for the greatest possible pattern density, which implies a low spatial period for the propagation patterns (for instance 4 μm). According to another aspect of the invention, the latter zone has additional thin chevrons of a material having a high degree of magnetic permeability which are located quite close to the substrate, whereby the propagation of the bubbles is enhanced for a given value of the rotating field. Such additional chevrons may be obtained without a supplemental manufacturing step by locating them at the same level as the detection elements 30. Junctions 78 (FIG. 12) between the storage zone and the read and replication means must be formed. Such junctions may be in hybrid technology, with a junction between the two levels obtained by photolithography.

The invention may even be used in magnetic bubble memory devices which use DNI technology rather than implanted patterns. It is particularly suitable for use in hybrid DNI/iron-nickel pattern devices where the storage zone uses DNI technology with a low space propagation period, typically with folded storage loops as shown in FIG. 12.

Then, the end portions of each loop should be provided with junctions with the zones which have iron-nickel patterns (adjacent transfer gates 14 and replication gates 18). The junctions as such may be as described in U.S. Pat. No. 4,546,452. For satisfactory operation of such junctions, progressive implantation has been proposed (U.S. Pat. No. 4,503,517) but such progressivity is difficult to control. According to an aspect of the invention, thin iron-nickel patterns which can be manufactured by photolithography are provided with overlap both the implanted zone and the adjacent zone. They dumpen on the field peak and make it easier for the bubbles to jump the transition between the zones. Such patterns may be as illustrated in FIG. 13.

I claim:

1. A magnetic bubble memory device having: a garnet substrate; and insulating layer on said substrate; bubble propagation patterns of high magnetic permeability material arranged in rows in a storage zone, a bubble stretching zone and a detection zone of said device; means for impressing a bias field in a direction orthogonal to said insulating layer and rows; and means for impressing a rotating field rotating about the direction of the bias field; the patterns in said bubble stretching zone having a shape and distribution such that said rotating field causes the bubbles to progress along the patterns in said bubble stretching zone and said detection zone having stripshaped thin detection elements each under of of the rows in the detection zone, said bubble memory device further including additional thin localized elements of high magnetic permeability material having a thickness lower than that of said patterns by at least one order of magnitude, obtained by photolithography and located at the same level as the thin detection elements, having a shape different from and cooperating with said patterns in the stretching zone for maintaining the voltage well generated by the rotating field at a substantially constant value in its movement along the patterns in the stretching zone.

2. Device according to claim 1, wherein said thick patterns in said bubble stretching zone are chevron-shaped and said thin localized elements are strip lengths of a material having high magnetic permeability located under the middle portion of arms of said chevrons for creating a pole in the middle portion of each arm.

3. Device according to claim 1, wherein said thick patterns in the stretching zone are chevron-shaped and the thin localized elements consist of additional chevrons located under said chevron-shaped thick patterns and have a length which is approximately half the length of the thick chevron-shaped patterns.

4. Device according to claim 1, wherein short additional elements of high magnetic permeability material are located at the same level as the detection elements and each located between two successive ones of the bubble propagation patterns in a same row of the storage zone and each of said short additional elements has a size much smaller than the span of bubble propagation patterns in a direction perpendicular to said row.

5. Device according to claim 1, further comprising a writing-in zone and a replication zone which have, in addition to said bubble propagation patterns, conductive tracks and thin iron-nickel elements at the same level as said detection elements.

6. Device according to claim 1, wherein said thin elements have a thickness of from 30 to 80 nm.

7. A magnetic bubble memory device having a garnet substrate: an insulating layer on said substrate; bubble propagation patterns of high magnetic permeability material arranged in rows in a storage zone, a bubble stretching zone and a detection zone of said device; means for impressing a bias field in a direction orthogonal to said insulating layer and rows; and means for impressing a rotating field rotating about the direction of the bias field; the patterns in said bubble stretching zone having a shape and distribution such that said rotating field causes the bubbles to progress along the patterns in said bubble stretching zone and said detection zone having thin detection elements each under one of the rows of the detection zone, consisting of high magnetic permeability material and having a thickness much lower than that of said patterns, obtainable by photolithography,
wherein each of said detection elements consists of a strip provided with barbs each constituting a chevron arm which projects away from the strip beyond the associated thick patterns toward an adjacent row of said thick patterns and have an angle with respect to the strip which is selected to enhance bubble propagation under the action of the rotating field.

8. Device according to claim 7, wherein the row of thick patterns associated with said detection element is directly adjacent to a chevron row provided with a dummy detection element.

9. Device according to claim 7 wherein said thin elements have a thickness of from 30 to 80 nm.

10. Device according to claim 7, wherein short additional elements of high magnetic permeability material are located at the same level as the detection elements and each located between two successive ones of the bubble propagation patterns in a same row of the storage zone and each of said short additional elements has a size much smaller than the span of bubble propagation patterns in a direction perpendicular to said row.

* * * * *

UNITED STATES PATENT AND TRADEMARK OFFICE
CERTIFICATE OF CORRECTION

PATENT NO. : 4,811,286
DATED : March 7, 1989
INVENTOR(S) : POIRIER, Michel

It is certified that error appears in the above—identified patent and that said Letters Patent is hereby corrected as shown below:

Title page:

The name of the assignee in item [73] of the title page is corrected to read as follows:

[73] SOCIETE D'APPLICATIONS GENERALES D'ELECTRICITE ET DE MECANIQUE SAGEM, Paris, France Signed and Sealed this Sixteenth Day of October, 1990

Attest:

HARRY F. MANBECK, JR.

*Attesting Officer*      *Commissioner of Patents and Trademarks*